US008048685B2

(12) United States Patent
Boivin (10) Patent No.: US 8,048,685 B2
(45) Date of Patent: Nov. 1, 2011

(54) MAGNETIC RAM (75) Inventor: Philippe Boivin, Venelles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 12/709,602

(22) Filed: Feb. 22, 2010

(65) Prior Publication Data
US 2010/0151595 A1    Jun. 17, 2010

Related U.S. Application Data (62) Division of application No. 11/323,073, filed on Dec. 30, 2005, now Pat. No. 7,692,228.

(30) Foreign Application Priority Data
Dec. 30, 2004  (FR) ....................... 04 53261

(51) Int. Cl.
*H01L 21/00* (2006.01)
(52) U.S. Cl. ................ 438/3; 438/95; 438/96
(58) Field of Classification Search ............... 438/3, 95, 438/96
See application file for complete search history.

(56) References Cited

U.S. PATENT DOCUMENTS

| 6,673,675 | B2 | 1/2004 | Yates et al. |
| 6,770,491 | B2 | 8/2004 | Tuttle |
| 6,828,639 | B2 | 12/2004 | Nejad et al. |
| 7,064,974 | B2 | 6/2006 | Suzuki et al. |
| 7,306,954 | B2 | 12/2007 | Nejad et al. |
| 7,315,071 | B2 | 1/2008 | Boivin |
| 2003/0230480 | A1* | 12/2003 | Tsuzumitani et al. ... 204/192.12 |
| 2004/0052150 | A1* | 3/2004 | Drewes ........................ 365/232 |
| 2005/0009210 | A1 | 1/2005 | Hosotani |
| 2005/0104102 | A1 | 5/2005 | Fukuzumi |
| 2005/0130413 | A1* | 6/2005 | Shimoto et al. ............... 438/637 |
| 2005/0164413 | A1 | 7/2005 | Meixner et al. |
| 2006/0011958 | A1 | 1/2006 | Jeong et al. |

OTHER PUBLICATIONS

Bruce F. Cockburn, tutorial on Magnetic Tunnel Junction Magnetoresistive Random-Access Memory, Records of the 2004 International Workshop on Memory Technology, Design and Testing (MTDT '04), 1087-4852/04.
French Search Report from French Patent Application 04/53261 filed Dec. 30, 2004.
French Search Report from French Patent Application 04/53260 filed Dec. 30, 2004.

* cited by examiner

*Primary Examiner* — N Drew Richards
*Assistant Examiner* — Jae Lee
(74) *Attorney, Agent, or Firm* — Lisa K. Jorgenson; James H. Morris; Wolf, Greenfield & Sacks, P.C.

(57) ABSTRACT

A memory element for a magnetic RAM, having a first magnetic portion in a first recess of a first insulating layer; and a non-magnetic portion and a second magnetic portion in a second recess of a second insulating layer covering the first insulating layer, the second recess exposing the first magnetic portion and a portion of the first insulating layer around the first magnetic portion, the non-magnetic portion being interposed between the first and second magnetic portions.

19 Claims, 4 Drawing Sheets

MAGNETIC RAM

RELATED APPLICATIONS

This application is a division of prior application Ser. No. 11/323,073, filed on Dec. 30, 2005, entitled "Magnetic Ram" which application claims the priority benefit of French patent application number 04/53261, filed on Dec. 30, 2004, entitled "Magnetic Ram", which applications are hereby incorporated by reference to the maximum extent allowable by law.

BACKGROUND OF THE INVENTION

1. Field of the Invention

The present invention relates to a magnetic random access memory or MRAM and a method for manufacturing such a memory.

2. Discussion of the Related Art

Figure 1:
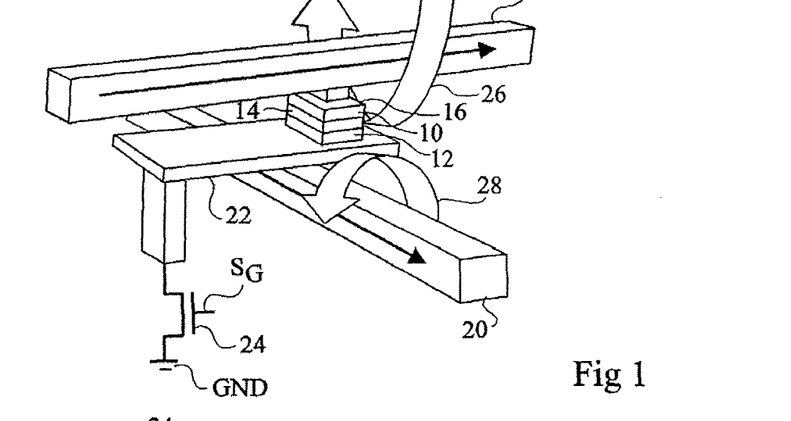
FIG. 1, previously described, illustrates the operation of a magnetic RAM.

FIG. 1 illustrates the operation of a magnetic RAM. Such a memory comprises an array of memory elements arranged in rows and in columns, a single memory element 10 being shown in FIG. 1. Each memory element 10 is formed of the stacking of three layers: a first layer 12 formed of a magnetic material, for example, cobalt, having a fixed magnetic orientation, a second layer 14 formed of an insulator, and a third layer 16 formed of a ferromagnetic material, for example, cobalt and iron alloy or a nickel and iron alloy, the magnetic orientation of which can vary. Insulating layer 14 behaves as a barrier to prevent the alloying between magnetic layer 12 and ferromagnetic layer 16 and enable the passing of electrons, the spin of which must be kept. Generally, each layer of the memory element may itself be formed of several layers. All the memory elements 10 of a same array column are connected to a conductive track 18, behaving as a bit line. A conductive track 20 is arranged above the memory elements 10 of a same array row but is not in electric contact with the memory elements of the row.

For each memory element 10 in the array, first layer 12 is connected via a portion 22 of connection to the drain (or to the source) of an N- or P-channel MOS transistor 24 having its source (or its drain) connected to a reference voltage, for example, ground GND. The gate of MOS transistor 24 is controlled by a gate control signal $S_G$. The MOS transistor associated with each memory element may be replaced with a diode circuit. MOS transistor 24 has the function of selecting in read mode the memory element 10 to be addressed.

As an example, magnetic layer 12 of memory element 10 has a magnetic moment vector with a fixed orientation, whatever the amplitude of the magnetic field in which the memory element is bathed. Ferromagnetic layer 16 then has a magnetic moment vector with an orientation that can be modified by applying a magnetic field. As an example, binary data may be stored in the memory element by orienting the magnetic moment vector of ferromagnetic layer 16 in parallel or in antiparallel with respect to the magnetic moment vector of magnetic layer 12.

A data write operation into memory element 10 is performed by flowing a current through bit line 18 and bit line 20 associated with the memory element. The flowing of a current in bit line 18 causes the forming of a magnetic field having the general orientation of the field lines represented by arrow 26. Similarly, the flowing of a current in word line 20 causes the forming of a magnetic field having the general orientation of its field lines represented by arrow 28. According to the flow direction of the current in bit line 18 and word line 20, the magnetic moment vector of ferromagnetic layer 16 is oriented in parallel or in antiparallel with respect to the magnetic moment vector of magnetic layer 12. In a write operation, MOS transistor 24 is on.

An operation of reading of the binary data stored in memory element 10 is performed by turning off transistor 24 associated with memory element 10 and by flowing a current therein via bit line 18. The determination of the data stored in the memory element is based on the difference of the resistance of memory element 10 according to the orientation difference of the magnetic moment vectors of ferromagnetic layer 16 and of magnetic layer 12.

FIGS. 2A to 2G show successive steps of a conventional example of a method for manufacturing such a memory element 10 in integrated form. Such a method is especially described in U.S. Pat. No. 6,673,675, which is incorporated herein by reference.

Figure 2A:
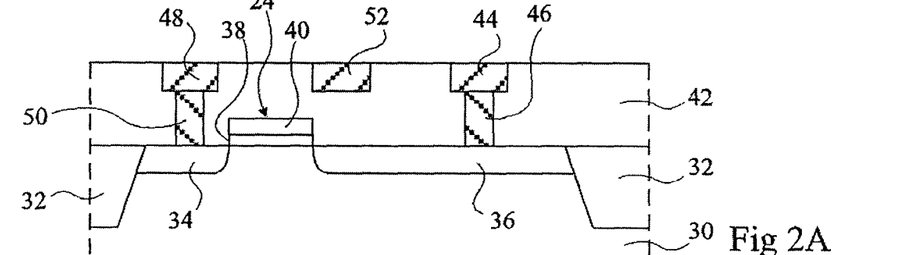
FIGS. 2A to 2G, previously described, illustrate successive steps of an example of a conventional method for manufacturing a magnetic RAM memory element.

As shown in FIG. 2A, the magnetic memory is formed on a substrate 30, for example, polysilicon, comprising insulation trenches 32 insulating the memory elements from one another. Two N-type doped regions 34, 36 form the source and drain regions of MOS transistor 24. The gate of MOS transistor 24 is formed of the stacking of a gate oxide layer 38, for example, silicon oxide, and of a gate layer 40, for example, polysilicon. Substrate 30 and the gate of MOS transistor 24 are covered with an insulating layer 42. A connection portion 44, for example, metallic, is buried at the surface of insulating layer 42 and is connected to doped region 36 via a contact 46. A connection portion 48, for example, metal, is buried at the surface of insulating layer 42 and is connected to doped region 34 via a via 50. Connection portion 48 is intended to be grounded. A conductive track 52, for example, metal, is buried at the surface of insulating layer 42 and forms word line 20.

Figure 2B:
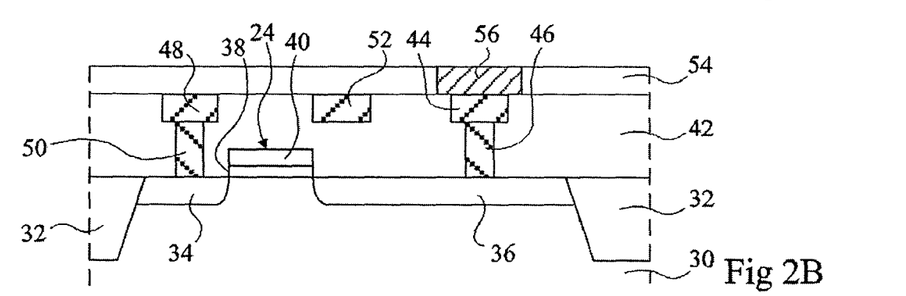

FIG. 2B shows the structure obtained after having covered insulating layer 42 with an insulating layer 54, and having formed, in insulating layer 54, a connection portion 56, for example, metal, in contact with connection portion 44.

Figure 2C:
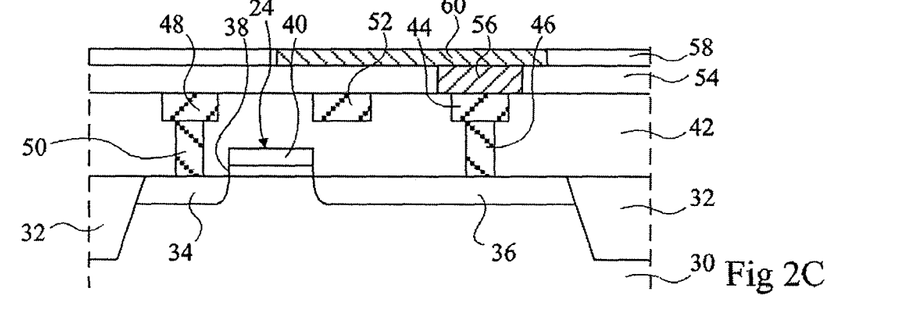

FIG. 2C shows the structure obtained after having covered insulating layer 54 with an insulating layer 58 and formed, in insulating layer 58, a connection portion 60, for example, metal, in contact with connection portion 56 and which extends substantially above word line 52.

Figure 2D:
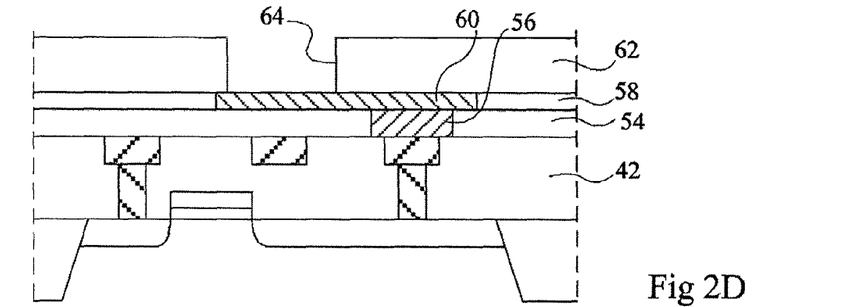

FIG. 2D shows the structure obtained after having covered insulating layer 54 with an insulating layer 62 and etched a recess 64 with substantially straight sides in insulating layer 54, exposing a portion of connection portion 60.

Figure 2E:
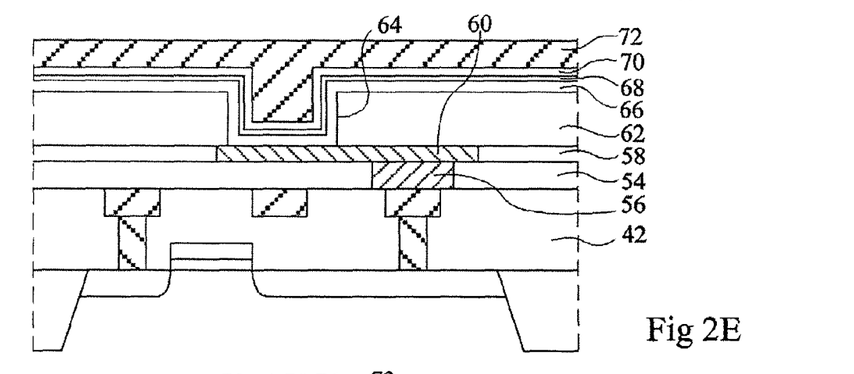

FIG. 2E shows the structure obtained after having deposited, for example, by vapor phase deposition or cathode sputtering, on insulating layer 62, a magnetic layer 66, an insulating layer 68, a ferromagnetic layer 70, and a conductive layer 72, for example, metal. The deposited layers penetrate into recess 64 so that magnetic layer 66 is in contact with connection portion 60. Generally, magnetic layer 66 has a thickness of approximately some ten nanometers, insulating layer 68 has a thickness of a few nanometers, and ferromagnetic layer 70 has a thickness of from some ten nanometers to a few tens of nanometers.

Figure 2F:
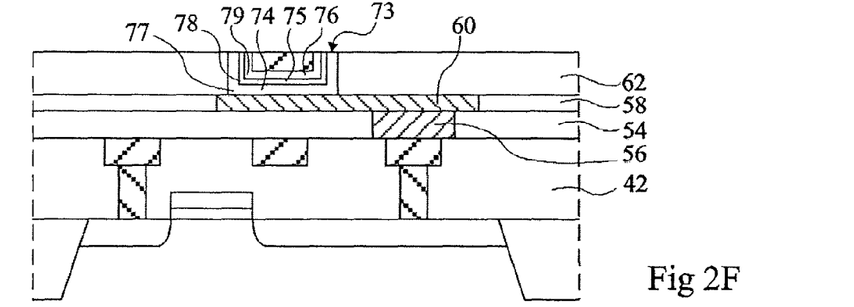

FIG. 2F shows the structure obtained after a chem./mech polishing (CMP) of layers 66, 68, 70, 72 down to insulating layer 62. A memory element 73 formed of the stacking of magnetic, insulating, and ferromagnetic portions 74, 75, and 76 is thus insulated. Portions 74, 75, 76 thus defined comprise corner areas 77, 78, 79. In other words, the resulting structure of memory element 73 after the planarization step has a "U"-shaped cross-section. Such corner areas 77, 78, 79 are undesirable since it is difficult to control the thickness of insulating portion 75 at the level of corner area 77. In particular, there is a risk for the thickness of insulating portion 75 to be locally decreased at the level of corner area 77. This may cause the occurrence of leakage currents between magnetic portion 74 and ferromagnetic portion 76, altering the operation of memory element 73. It is thus desirable to eliminate corner areas 77, 78, 79.

Figure 2G:
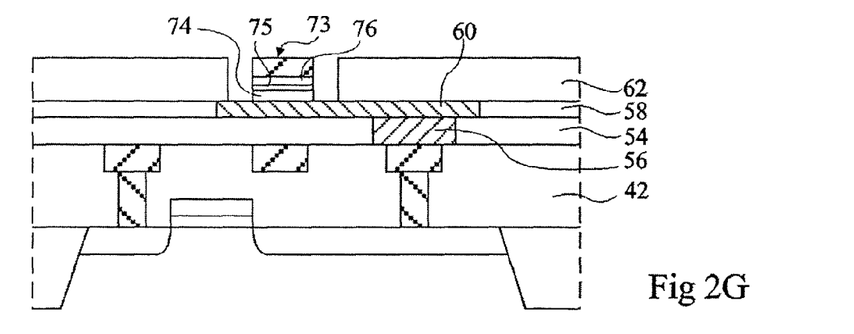

FIG. 2G shows the structure obtained after etching of corner areas 77, 78, 79 of memory element 73. A memory element 73 in which magnetic, insulating, and ferromagnetic portions 74, 75, and 76 are substantially planar is then obtained.

A disadvantage is that the materials generally used to form the memory elements are little reactive with the chemical etches conventionally used in integrated circuit manufacturing processes, since there is no forming of volatile compounds. It is thus necessary to use RIE-type etches (reactive ion etching) to eliminate corner areas 77, 78, 79 from memory element 73. A disadvantage of such etchings is that the materials etched by an RIE-type etch tend to deposit back on the walls of the etch chamber and/or on other portions of the integrated circuit. This may result in a soiling of the etch chamber, and/or, which is much more disturbing, the occurrence of defects at the integrated circuit level.

SUMMARY OF THE INVENTION

The present invention aims at obtaining a memory element for a magnetic RAM exhibiting no "corner area" and capable of being formed by a process comprising no RIE-type etch steps.

Another object of the present invention is to provide a method for manufacturing such a memory element which is compatible with manufacturing processes currently used for integrated circuits.

Another object of the present invention is to provide a method for manufacturing such a memory element which only slightly modifies the steps of the general RAM manufacturing process.

For this purpose, the present invention provides a memory element for a magnetic RAM, comprising a first magnetic portion in a first recess of a first insulating layer; and a non-magnetic portion and a second magnetic portion in a second recess of a second insulating layer covering the first insulating layer, the second recess exposing the first magnetic portion and a portion of the first insulating layer around the first magnetic portion, the non-magnetic portion being interposed between the first and second magnetic portions.

According to an embodiment of the present invention, the first magnetic portion is connected to a source or drain region of a field-effect transistor.

The present invention also provides a magnetic RAM comprising an array of memory elements, such as described previously, distributed in rows and columns, and comprising, for each row, a conductive track extending along the row and intended for the writing of data into the memory elements of the row, the memory elements of the row being arranged above the conductive track with an interposed insulating layer.

The present invention also provides a magnetic RAM comprising an array of memory elements, such as previously described, arranged in rows and columns, and comprising, for each row, two conductive tracks extending along the row and intended for the writing of data into the memory elements of the row, the memory elements of the row being arranged at the level of the plane equidistant from the two conductive tracks.

The present invention also provides a method for manufacturing a magnetic memory element comprising digging a first recess into a first insulating layer; forming a first magnetic layer in the first recess and on the first insulating layer; etching, by chem/mech polishing, the first magnetic layer and a portion of the first insulating layer to delimit a first magnetic portion in the first recess; forming a second insulating layer; digging a second recess into the second insulating layer exposing the first magnetic portion and a portion of the first insulating layer around the first magnetic portion; forming a non-magnetic layer and a second magnetic layer in the second recess and on the second insulating layer; and etching, by chem/mech polishing, the second magnetic layer, the non-magnetic layer, and a portion of the second insulating layer to delimit a non-magnetic portion and a second magnetic portion in the second recess.

According to an embodiment of the present invention, the method comprises the previous steps of providing a silicon substrate at the level of which is formed a doped region; forming an insulating layer; forming a connection portion connected to the doped region and a conductive track adjacent to the connection portion, the conductive track being intended for the writing of data into the memory element; forming an insulating layer; forming a connection portion in contact with the intermediary connection portion and overhanging the conductive track; and forming said memory element above the conductive track, the first magnetic portion being connected to the connection portion.

According to an embodiment of the present invention, the method comprises the previous steps of providing a silicon substrate at the level of which is formed a doped region; forming an insulating layer; forming a connection portion connected to the doped region and two conductive tracks on either side of the connection portion, the two conductive tracks being intended for the writing of data into the memory element; and forming said memory element at the level of the plane equidistant from the two conductive tracks, the first magnetic portion being connected to the connection track.

The foregoing and other objects, features, and advantages of the present invention will be discussed in detail in the following non-limiting description of specific embodiments in connection with the accompanying drawings.

DETAILED DESCRIPTION

For clarity, the same elements have been designated with the same reference numerals in the different drawings and, further, as usual in the representation of integrated components, the various drawings are not to scale.

A first example of a process according to the present invention for manufacturing a magnetic RAM memory element will now be described in relation with FIGS. 3A to 3E. The initial steps of the first method example correspond to the steps previously described in relation with FIGS. 2A to 2D.

Figure 3A:
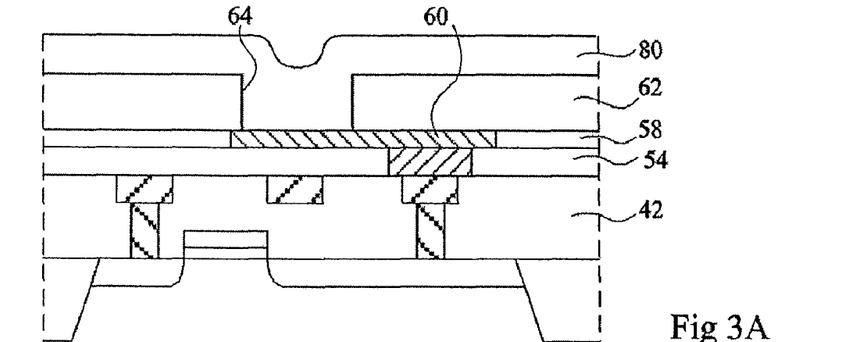
FIGS. 3A to 3E illustrate successive steps of a first example of a manufacturing process according to the present invention of a magnetic RAM memory element.

FIG. 3A shows the structure obtained after having deposited, for example, by vapor phase deposition, a layer 80 of a magnetic material, for example, cobalt, on insulating layer 62 and in recess 64. Magnetic layer 80 penetrates into recess 64 to be in contact with connection portion 60. According to a variation of the present invention, insulating layers 58 and 62 correspond to a single insulating layer which is deposited after forming of connection portion 60.

Figure 3B:
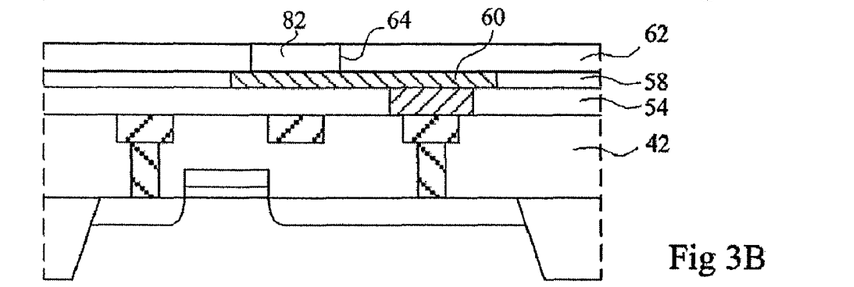

FIG. 3B shows the structure obtained after a step of chem/mech polishing of magnetic portion 80 and of a portion of insulating layer 62 to delimit a magnetic portion 82 at the level of recess 64.

Figure 3C:
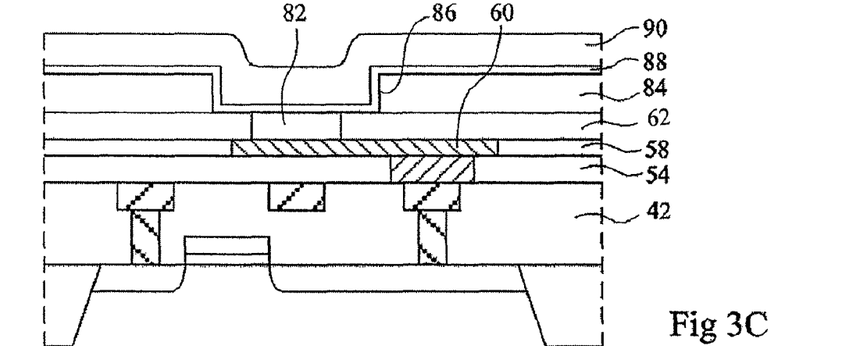

FIG. 3C shows the structure obtained after a step of deposition of an insulating layer 84 on the structure of FIG. 3B, of etching of a recess 86 in insulating layer 84 to expose the entire magnetic portion 82 and a portion of insulating layer 62 surrounding magnetic portion 82, and of successive depositions, for example, by vapor phase deposition, of an oxide layer 88, and of a layer of a ferromagnetic material 90, for example, a cobalt and iron alloy or a nickel and iron alloy, on insulating layer 84 and in recess 86.

Figure 3D:
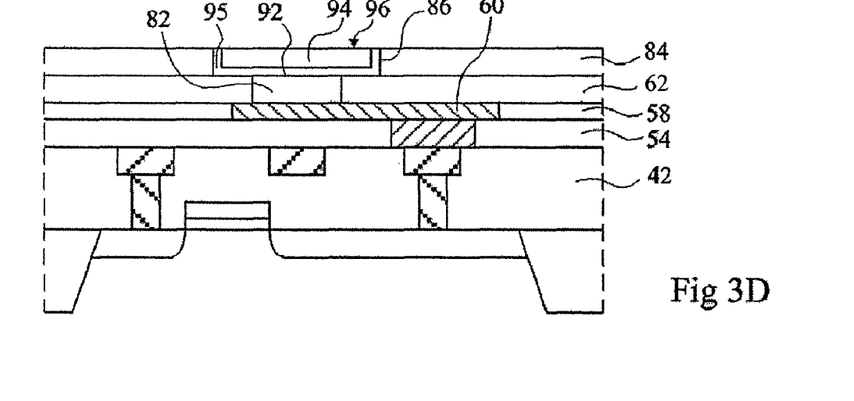

FIG. 3D shows the structure obtained after a step of etching by chem/mech polishing of ferromagnetic and oxide layers 90 and 89 and of a portion of insulating layer 84 to delimit at the level of recess 86 an oxide portion 92 and a ferromagnetic portion 94. A memory element 96 comprising a "corner" area 95 at the level of the periphery of oxide portion 92 is thus obtained.

Figure 3E:
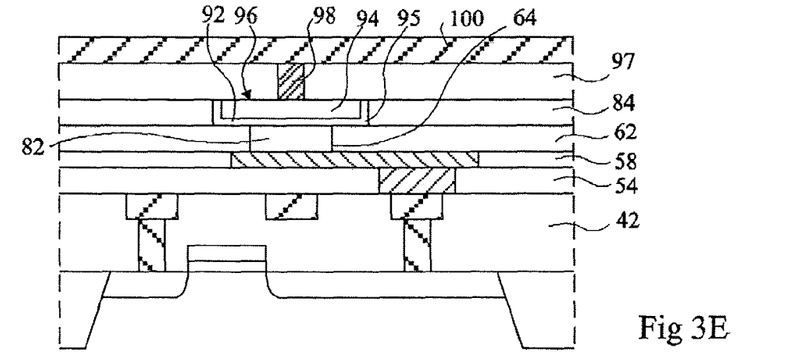

FIG. 3E shows the structure obtained after a step in which insulating layer 84 has been covered with an insulating layer 97, a via 98 has been formed, in insulating layer 97, coming to contact ferromagnetic portion 94, and a conductive track 100 has been formed on insulating layer 97 in contact with via 98. Conductive track 100 corresponds to the bit line associated with the column of the magnetic RAM to which memory element 96 belongs.

According to a variation of the present invention, a metal layer is deposited above ferromagnetic layer 90. After the etch step, previously described in relation with FIG. 3D, a metal portion is then delimited at the level of ferromagnetic portion 94. Via 98 is then formed at the contact of the metal portion.

The "active" region of memory element 96 corresponds to the region of oxide portion 92 for which magnetic portion 82 and ferromagnetic portion 94 are opposite. Corner area 95 of oxide portion 92 is not disturbing since it is not located at the level of the active region of memory element 96. A local decrease in the thickness of oxide portion 92 at the level of corner area 95 thus does not disturb the operation of memory element 96. Further, the present manufacturing method comprises no RIE-type etch steps since memory element 96 is only delimited by chem/mech polishing steps. Thereby, the risk of uncontrolled deposition of the materials forming the memory element in the etch chamber or on the integrated circuit, characteristic of an RIE-type etch, is avoided.

A second example of a method for manufacturing according to the present invention a magnetic memory will now be described in relation with FIGS. 4A to 4D.

Figure 4A:
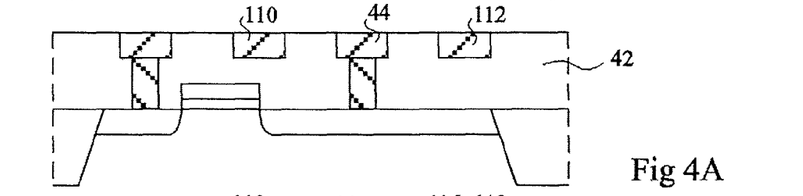
FIGS. 4A to 4D illustrate steps of a second example of a magnetic RAM memory element manufacturing process according to the present invention.

FIG. 4A shows a structure similar to FIG. 2A. However, conversely to the structure shown in FIG. 2A, two conductive tracks 110, 112 corresponding to two word lines are provided for each row of the magnetic RAM. For each memory element of a same row, conductive tracks 110, 112 extend on either side of connection portion 44.

Figure 4B:
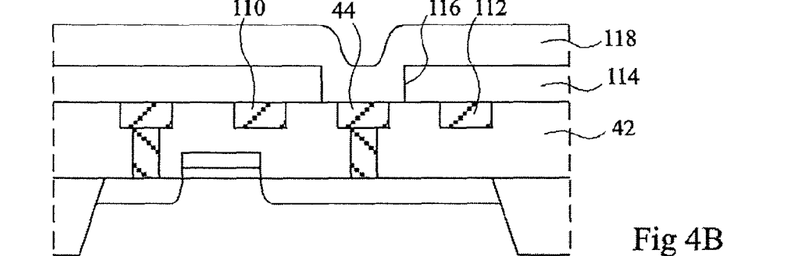

FIG. 4B shows the structure obtained after deposition of an insulating layer 114 on insulating layer 42, the etching of a recess 116 in insulating layer 42 which exposes connection portion 44, and the deposition of a layer of a magnetic material 118, for example, cobalt-based, on insulating layer 114. Magnetic layer 118 penetrates into recess 116 to contact connection portion 44.

Figure 4C:
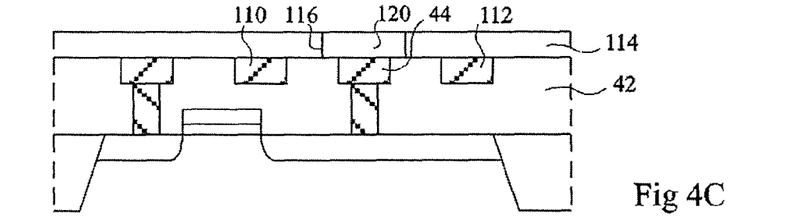

FIG. 4C shows the structure obtained after a chem/mech polishing of magnetic layer 118 and of a portion of insulating layer 114 to delimit a magnetic portion 120 in recess 116.

Figure 4D:
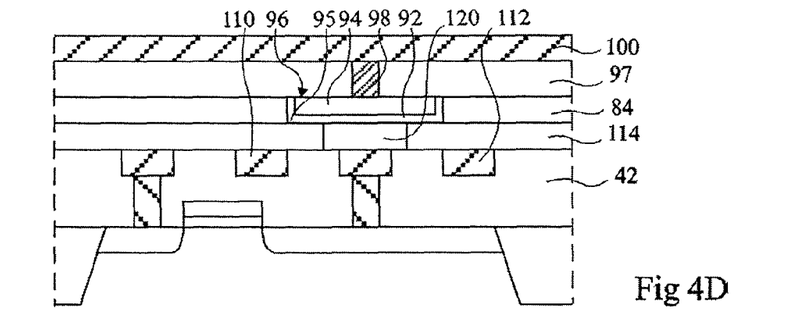

FIG. 4D shows the structure obtained after implementation of steps similar to those illustrated in relation with FIGS. 3C and 3D of the first example of embodiment.

The structure of memory element 96 obtained by the second example of a manufacturing process according to the present invention is identical to that obtained by the first example of a manufacturing process according to the present invention. In particular, corner area 95 of oxide portion 92 is insulated from the active region of memory element 96 and does not disturb its operation.

An operation of data writing into memory element 96 is performed by running a current in the bit line and currents of opposite directions in word lines 110, 112. A magnetic field having its maximum amplitude substantially at the level of a plane equidistant from word lines 110, 112, that is, substantially at the level of magnetic memory element 96 is then obtained.

In the first example of embodiment in which a single word line 52 is associated with each row of the magnetic RAM, it is necessary for memory element 96 to be arranged above word line 52 to benefit from a magnetic field of maximum amplitude in a write generation. In the second method example, the magnetic field has a maximum amplitude at the level of the plane equidistant from the two word lines 110, 112. This enables leaving memory element 96 above connection portion 44. It is then no longer necessary to provide the steps of deposition of insulating layers 54 and 58 and the steps of forming of connection portions 56 and 60 of the first method example. The second method example thus enables reducing the number of masks to be provided for the memory element manufacturing.

According to a variation of the previously-described examples of embodiment, the MOS transistor associated with each memory element and used for the reading of the data stored at the level of the memory element may be replaced with a diode circuit.

According to another variation of the previously-described examples of embodiment, a single word line is associated with each row of the magnetic RAM and is connected to all the memory elements in the row. Each memory element is then caught between the bit line and the word line associated with the memory element. An operation of reading of the data stored at the level of a memory element is then performed by running a current through the memory element via the bit line and the word line associated with the memory element. Such an alternative embodiment enables suppressing the MOS transistor associated with each memory element.

The present invention has many advantages.

First, it enables obtaining a magnetic RAM for which, at the level of the active region of each memory element, the thickness of the oxide portion is relatively uniform.

Second, the steps of the manufacturing process of each memory element according to the present invention relative to the etching of the materials forming the memory element only implement chem/mech polishing steps instead of RIE-type etchings. The disadvantages of RIE-type etchings are thus avoided.

Third, the manufacturing process according to the present invention only implements layer deposition steps and chem/mech polishing etch steps, which are compatible with usual integrated circuit manufacturing processes.

Fourth, the manufacturing process according to the present invention comprises but a small number of additional steps and thus only slightly modifies usual magnetic RAM manufacturing steps.

Of course, the present invention is likely to have various alterations, modifications, and improvements which will occur to those skilled in the art. In particular, the magnetic layer, the oxide layer, and the ferromagnetic layer based on which the memory element is formed may each be formed of the stacking of several layers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a magnetic memory element, the method comprising:
    providing a first insulating layer;
    forming a first recess in the first insulating layer;
    forming a first magnetic layer in the first recess of the first insulating layer;
    etching the first magnetic layer and a portion of the first insulating layer to provide a first magnetic portion in the first recess;
    forming a second insulating layer over the first insulating layer and the first magnetic portion;
    forming a second recess in the second insulating layer to expose an entire top surface of the first magnetic portion and a portion of the first insulating layer that is positioned laterally beyond a periphery of the first magnetic portion;
    forming a non-magnetic layer in the second recess and on the second insulating layer, the non-magnetic layer extending beyond the periphery of the first magnetic portion and the non-magnetic layer extending an entire width of the second recess;
    forming a second magnetic layer in the second recess and on the non-magnetic layer, the second magnetic layer extending beyond the periphery of the first magnetic portion;
    etching the second magnetic layer, the non-magnetic layer, and a portion of the second insulating layer to delimit a non-magnetic portion and a second magnetic portion in the second recess, wherein the non-magnetic layer contacts both the first and second magnetic portions;
    forming a third insulating layer covering the second insulating layer; and
    forming a via disposed in a third recess of the third insulating layer, the via contacting both the second magnetic portion and a first conductive track.

2. The method of claim 1, wherein providing the first magnetic portion comprises providing a magnetic portion that is connected to a source or drain region of a field-effect transistor.

3. A method of manufacturing a magnetic RAM comprising forming an array of memory elements according to the method of claim 1, the array of memory elements being distributed in rows and columns, and comprising, for each row, a second conductive track extending along the row and intended for the writing of data into the memory elements of the row, the memory elements of the row being arranged above the second conductive track with an interposed insulating layer.

4. A method of manufacturing a magnetic RAM comprising forming an array of memory elements according to the method of claim 1, the array of memory elements being distributed in rows and columns, and comprising, for each row, two conductive tracks extending along the row and intended for the writing of data into the memory elements of the row, the memory elements of the row being arranged at the level of the plane equidistant from the two conductive tracks.

5. A method for manufacturing a magnetic memory element, the method comprising:
    providing a first insulating layer having a first recess and a magnetic portion in the first recess;
    forming a second insulating layer over the first insulating layer and the magnetic portion;
    forming a second recess in the second insulating layer to expose the magnetic portion and a portion of the first insulating layer around the magnetic portion;
    forming a non-magnetic layer in the second recess and on the second insulating layer, the non-magnetic layer extending beyond a periphery of the magnetic portion;
    forming a ferromagnetic layer in the second recess and on the non-magnetic layer, the ferromagnetic layer extending beyond the periphery of the magnetic portion;
    etching the ferromagnetic layer, the non-magnetic layer, and a portion of the second insulating layer to delimit a non-magnetic portion and a ferromagnetic portion in the second recess, such that an exposed portion of the ferromagnetic portion is positioned over the magnetic portion;
    providing a silicon substrate;
    forming a doped region on the silicon substrate;
    forming a third insulating layer;
    forming an intermediary connection portion connected to the doped region and a conductive track adjacent to the connection portion, the conductive track being intended for writing of data into the memory element;
    forming a fourth insulating layer;
    forming a connection portion in contact with the intermediary connection portion and overhanging the conductive track; and
    forming said memory element above the conductive track, the magnetic portion being connected to the connection portion.

6. The method of claim 5, wherein etching the ferromagnetic layer, the non-magnetic layer, and the portion of the second insulating layer comprises chem/mech polishing of the ferromagnetic layer, the non-magnetic layer, and the portion of the second insulating layer.

7. The method of claim 5, wherein forming the non-magnetic layer in the second recess and on the second insulating layer comprises forming a corner of the non-magnetic layer at a level of the second insulating layer whereby the corner of the non-magnetic layer is outside the periphery of the magnetic portion.

8. The method of claim 7, wherein forming the ferromagnetic layer in the second recess and on the non-magnetic layer comprises forming a corner of the ferromagnetic layer at the corner of the non-magnetic layer whereby the corner of the ferromagnetic layer is outside the periphery of the magnetic portion.

9. The method of claim 5, wherein providing the first insulating layer having the first recess and the magnetic portion in the first recess comprises:
    forming the first recess in the first insulating layer;
    forming a magnetic layer in the first recess of the first insulating layer; and etching the magnetic layer and a portion of the first insulating layer to provide the magnetic portion in the first recess.

10. The method of claim 5, wherein forming the second recess in the second insulating layer exposes an entire top surface of the magnetic portion and a portion of the first insulating layer that is positioned laterally beyond a periphery of the magnetic portion.

11. The method of claim 5, wherein forming the non-magnetic layer in the second recess comprises forming the non-magnetic layer to extend an entire width of the second recess and contacting the non-magnetic layer with both the first and ferromagnetic portions.

12. The method of claim 5, wherein the magnetic portion is made of cobalt.

13. A method for manufacturing a magnetic memory element, the method comprising:
providing a first insulating layer having a first recess and a magnetic portion in the first recess;
forming a second insulating layer over the first insulating layer and the magnetic portion;
forming a second recess in the second insulating layer to expose the magnetic portion and a portion of the first insulating layer around the magnetic portion;
forming a non-magnetic layer in the second recess and on the second insulating layer, the non-magnetic layer extending beyond a periphery of the magnetic portion;
forming a ferromagnetic layer in the second recess and on the non-magnetic layer, the ferromagnetic layer extending beyond the periphery of the magnetic portion;
etching the ferromagnetic layer, the non-magnetic layer, and a portion of the second insulating layer to delimit a non-magnetic portion and a ferromagnetic portion in the second recess, such that an exposed portion of the ferromagnetic portion is positioned over the magnetic portion;
providing a silicon substrate;
forming a doped region on the silicon substrate;
forming a third insulating layer;
forming a connection portion connected to the doped region and two conductive tracks on either side of the connection portion, the two conductive tracks being intended for writing of data into the memory element; and
forming said memory element along a plane equidistant from the two conductive tracks, the magnetic portion being connected to the connection track.

14. A method for manufacturing a magnetic memory element, the method comprising:
providing a first insulating layer having a first recess and a magnetic portion in the first recess;
forming a second insulating layer over the first insulating layer and the magnetic portion;
forming a second recess in the second insulating layer to expose the magnetic portion and a portion of the first insulating layer around the magnetic portion;
forming a non-magnetic layer in the second recess and on the second insulating layer, the non-magnetic layer extending beyond a periphery of the magnetic portion;
forming a ferromagnetic layer in the second recess and on the non-magnetic layer, the ferromagnetic layer extending beyond the periphery of the magnetic portion;
etching the ferromagnetic layer, the non-magnetic layer, and a portion of the second insulating layer to delimit a non-magnetic portion and a ferromagnetic portion in the second recess, such that an exposed portion of the ferromagnetic portion is positioned over the magnetic portion;
forming a third insulating layer covering the second insulating layer; and
forming a via disposed in a third recess of the third insulating layer, the via contacting both the ferromagnetic portion and a first conductive track.

15. A method for manufacturing a magnetic memory element, the method comprising:
forming a first insulating layer;
digging a first recess into the first insulating layer;
forming a magnetic layer in the first recess of the first insulating layer;
etching the magnetic layer and a portion of the first insulating layer to delimit a magnetic portion in the first recess;
forming a second insulating layer;
digging a second recess into the second insulating layer to expose the magnetic portion and a portion of the first insulating layer around the magnetic portion;
forming a non-magnetic layer and a ferromagnetic layer in the second recess and on the second insulating layer;
etching the ferromagnetic layer, the non-magnetic layer, and a portion of the second insulating layer to delimit a non-magnetic portion and a ferromagnetic portion in the second recess, such that an exposed portion of the ferromagnetic portion is positioned over the magnetic portion;
forming a third insulating layer covering the second insulating layer; and
forming a via disposed in a third recess of the third insulating layer, the via contacting both the ferromagnetic portion and a first conductive track.

16. The method of claim 15, wherein digging the second recess into the second insulating layer exposes an entire top surface of the magnetic portion and a portion of the first insulating layer that is positioned laterally beyond a periphery of the magnetic portion.

17. The method of claim 15, wherein forming a non-magnetic layer in the second recess comprises forming the non-magnetic layer to extend an entire width of the second recess and contacting the non-magnetic layer with both the first and ferromagnetic portions.

18. A method for manufacturing a magnetic memory element, the method comprising, forming a first insulating layer;
digging a first recess into the first insulating layer;
forming a magnetic layer in the first recess of the first insulating layer;
etching the magnetic layer and a portion of the first insulating layer to delimit a magnetic portion in the first recess;
forming a second insulating layer;
digging a second recess into the second insulating layer to expose the magnetic portion and a portion of the first insulating layer around the magnetic portion;
forming a non-magnetic layer and a ferromagnetic layer in the second recess and on the second insulating layer;
etching the ferromagnetic layer, the non-magnetic layer, and a portion of the second insulating layer to delimit a non-magnetic portion and a ferromagnetic portion in the second recess, such that an exposed portion of the ferromagnetic portion is positioned over the magnetic portion;
providing a silicon substrate;
forming a doped region on the silicon substrate;
forming a third insulating layer;

forming an intermediary connection portion connected to the doped region and a conductive track adjacent to the connection portion, the conductive track being configured for writing of data into the memory element;

forming a fourth insulating layer;

forming a connection portion in contact with the intermediary connection portion and overhanging the conductive track; and forming said memory element above the conductive track, the magnetic portion being connected to the connection portion.

19. A method for manufacturing a magnetic memory element, the method comprising:

forming a first insulating layer;

digging a first recess into the first insulating layer;

forming a magnetic layer in the first recess of the first insulating layer;

etching the magnetic layer and a portion of the first insulating layer to delimit a magnetic portion in the first recess;

forming a second insulating layer;

digging a second recess into the second insulating layer to expose the magnetic portion and a portion of the first insulating layer around the magnetic portion;

forming a non-magnetic layer and a ferromagnetic layer in the second recess and on the second insulating layer;

etching the ferromagnetic layer, the non-magnetic layer, and a portion of the second insulating layer to delimit a non-magnetic portion and a ferromagnetic portion in the second recess, such that an exposed portion of the ferromagnetic portion is positioned over the magnetic portion;

providing a silicon substrate;

forming a doped region on the silicon substrate;

forming a third insulating layer;

forming a connection portion connected to the doped region and two conductive tracks on either side of the connection portion, the two conductive tracks being configured for writing of data into the memory element; and forming said memory element along a plane equidistant from the two conductive tracks, the magnetic portion being connected to the connection track.

* * * * *